(12) United States Patent
Wong

(10) Patent No.: US 6,426,673 B2
(45) Date of Patent: Jul. 30, 2002

(54) HIGH PERFORMANCE INTEGRATED RADIO FREQUENCY CIRCUIT DEVICES

(75) Inventor: Ting-Wah Wong, Cupertino, CA (US)

(73) Assignee: Programmable Silicon Solutions, San Jose, CA (US)

( * ) Notice: Subject to any disclaimer, the term of this patent is extended or adjusted under 35 U.S.C. 154(b) by 0 days.

(21) Appl. No.: 09/789,198

(22) Filed: Feb. 20, 2001

Related U.S. Application Data

(63) Continuation-in-part of application No. 08/903,549, filed on Jul. 30, 1997.

(51) Int. Cl.[7] .............................................. H01L 25/00
(52) U.S. Cl. ...................................... 327/566; 327/565
(58) Field of Search ................................. 327/564–566

(56) References Cited

U.S. PATENT DOCUMENTS

| | | | |
|---|---|---|---|
| 3,764,396 A | 10/1973 | Tarui et al. ................... 148/1.5 |
| 4,628,307 A | 12/1986 | Crouse .................. 340/825.05 |
| 4,943,943 A | 7/1990 | Hayashi et al. ............. 365/185 |
| 4,954,730 A | 9/1990 | Yoh .......................... 307/451 |
| 5,108,104 A | 4/1992 | Urai ........................... 365/200 |
| 5,251,169 A | 10/1993 | Josephson .................... 365/72 |
| 5,420,817 A | * 5/1995 | Kitagawa et al. ............. 365/96 |
| 5,457,653 A | 10/1995 | Lipp ..................... 365/185.18 |
| 5,541,529 A | 7/1996 | Mashiko et al. ............... 326/39 |
| 5,818,087 A | 10/1998 | Yee .............................. 257/355 |
| 5,818,758 A | 10/1998 | Wojciechowski ...... 365/185.18 |
| 5,835,414 A | 11/1998 | Hung et al. ............ 365/185.25 |
| 5,893,733 A | * 4/1999 | Yee ............................. 438/238 |

OTHER PUBLICATIONS

Streetman, "Solid State Electronic Devices", Second Edition, Prentice–Hall, 1980, pp. 311–321.

Peng et al., "Impact of Tunnel Oxide Quality on $V_t$ Disturb and Sort Yield of High Density Flash Memory FPGA Devices", Abstract for 1997 NVSMW (1997), pp, 1–2.

* cited by examiner

*Primary Examiner*—Kenneth B. Wells
(74) *Attorney, Agent, or Firm*—Trop, Pruner & Hu, P.C.

(57) ABSTRACT

A radio frequency device may be formed which has high power output and high transistor switching speeds. This may be done by providing thicker gate oxides and a higher supply potential to transistors utilized to form the power amplifier and using thinner gate oxides conventionally associated with high switching speed and advanced process technologies for other applications on the same integrated circuit. Thus, high switching speeds can be achieved-with some transistors which utilize a lower supply voltage and high power output can be achieved from other transistors which are coupled to a higher supply voltage. The different types of transistors may be made in the same integrated circuit fabrication process on the same integrated circuit.

17 Claims, 4 Drawing Sheets

HIGH PERFORMANCE INTEGRATED RADIO FREQUENCY CIRCUIT DEVICES

This application is a continuation-in-part of application Ser. No. 08/903,549 filed Jul. 30, 1997

BACKGROUND

This invention relates generally to integrated circuits for radio frequency devices and particularly to advanced integrated circuits which use lower supply voltages and smaller device geometries.

As integrated circuits scale to smaller and smaller geometries and supply voltages continue to decrease, a number of technologies which rely on voltage differences have become increasingly more difficult to implement in an effective fashion. The use of smaller voltages means that the speed at which devices operate may be diminished.

As integrated circuits have scaled to smaller and smaller geometries, designers have been effective in reducing the power supply voltages which such devices utilize. While it is very advantageous to decrease the necessary power supply voltage, a number of problems arise with respect to the "on" resistance when the supply voltage decreases. See L. A. Glasser and D. W. Dobberpuhl, *The Design and Analysis of VLSI Circuits*, (December 1985) published by Addison-Wesley Publishing Co. at page 108. The transistor linear region resistance is inversely proportional to the gate to source voltage or "$V_{GS}$" less the threshold voltage or "$V_T$".

As the supply voltage is scaled to ever lower voltages, this voltage difference can be reduced significantly. In addition, the transistor saturation voltage scales as $(V_{GS}-V_T)$ decreases. As the device geometry scales, transistors may also run into what is known as "velocity saturation". Thus, the voltage range where the transistor operates in the linear region becomes increasing narrow as geometries and supply voltages are scaled.

Radio frequency devices, as used herein, are integrated circuits that generate signals in the radio frequency range. Many of these devices include not only analog processing functions but logic functions as well. This is particularly true as integrated circuits advance to the point where both logic and analog processing are on the same integrated circuit. For example, if a cellular telephone were to be integrated into a single integrated circuit for cost reduction and increased performance reasons, an integrated microprocessor and analog radio frequency section may be included on the exact same integrated circuit.

Thus, in at least some analog radio frequency processing applications, it may be desirable to have the latest transistor technology which achieves the highest operating speed due to the higher transistor switching speeds. This generally means that the geometries for feature sizes of the integrated circuit elements must be scaled progressively smaller and smaller. At the same time, smaller geometries generally mean lower operating voltages. Thus, as the geometries of the transistors become smaller and more integrated circuit transistors are packed into the same unit area, the supply voltages are progressively decreasing. Lower supply voltages may be advantageous since not only are they amenable to ever smaller geometries, but they may also result in less power consumption. This may be a particular issue in battery powered devices.

However, a problem arises with respect to at least one component particularly utilized in connection with radio frequency devices. Radio frequency devices need a power amplifier which is capable of amplifying an input signal to substantially higher levels for transmission by these radio-frequency devices. Thus, a relatively compact portable device, as one example, needs to have a transmitter that is powerful enough to generate a radio frequency signal that can be received at a sufficient distance away to make the device useful.

Of course, with the latest transistor technologies, the available transistors may be relatively fast but they may also have relatively low voltage power supplies. Thus, the design of the power amplifier is relatively difficult because the power from the power amplifier is a function of the square of the supply voltage divided by the resistance. Thus, the lower the supply voltage, the less power that can be generated by the power amplifier. And even if the resistance of the smaller geometry integrated circuit is significantly less, a limit is reached with respect to the amplitude of the power that may be generated. Particularly since power is related to the square of the voltage, it is relatively important to provide sufficient voltage levels to increase power output from power amplifiers.

Thus, there is a need for a radio frequency integrated circuit device with both a power amplifier that can generate sufficient power and, at the same time, relatively high frequency, smaller geometry transistors.

DETAILED DESCRIPTION

Figure 1:
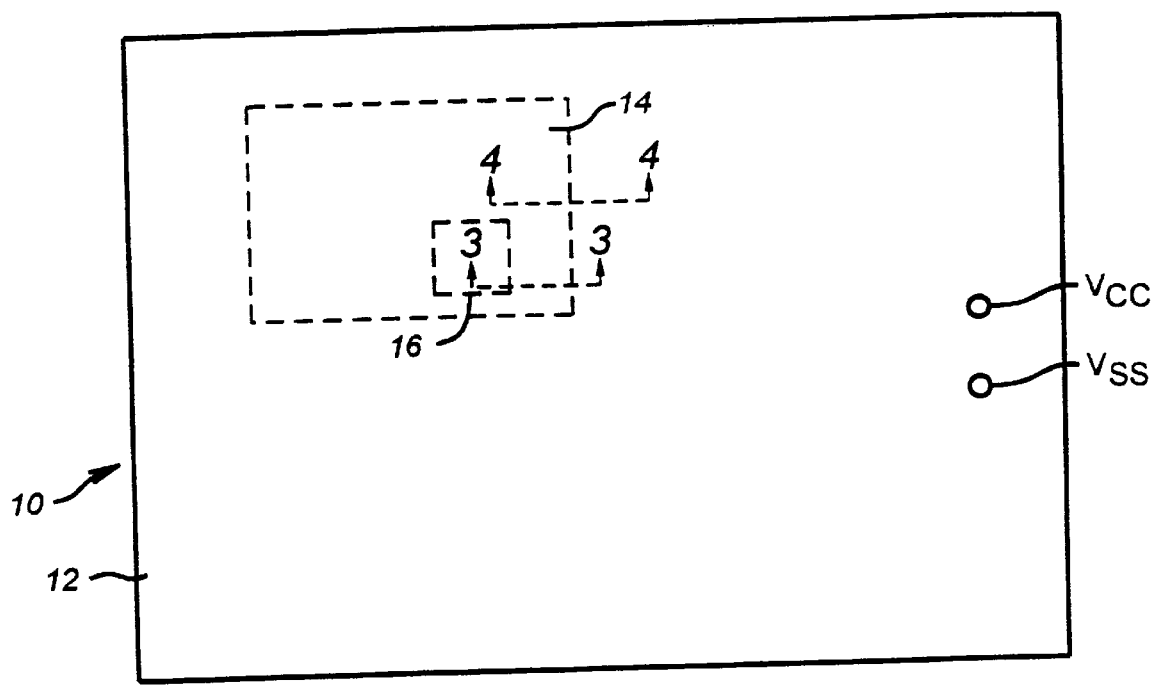
FIG. 1 is a greatly enlarged top plan view of a die in accordance with one embodiment of the present invention.

Referring to FIG. 1, an integrated circuit device is implemented on a semiconductor die 10 which is formed by cutting the die from a conventional semiconductor wafer (not shown). Formed on the die 10 are a large number of MOS transistors connected to implement the desired device functionality.

The majority of the topology of the die 10 may be taken up by the area 12, populated by conventional logic circuitry. The area 14 of the die 10 has MOS transistors (not shown) having gate oxides which are thicker than the gate oxides of the transistors formed in the area 12. A subset of the area 14, labeled 16 in FIG. 1, includes devices having a thicker gate oxide that are formed in an embedded P-well (not shown). In this way, transistors with at least two different gate oxide thicknesses are provided and certain devices may be formed in an embedded P-well (or triple well) to enable them to operate more efficiently with negative source bias.

While the die 10 has been explained in terms of an example where transistors are segregated based on gate oxide thicknesses and use the embedded wells, it will be appreciated that the different device types can be physically distributed among one another as well. Similarly, the relative sizes of the areas 12, 14, and 16 can be varied in accordance with specific needs.

Figure 2:
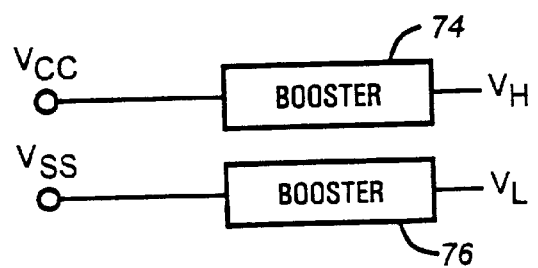
FIG. 2 is a schematic view of the die power supplies.

As shown in FIG. 2, the die 10 may receive two external supply voltages Vcc and $V_{ss}$. The supply voltage Vcc may be 5 volts or less and the voltage Vss may be 0 volts. The supply voltages Vcc and Vss are boosted by boosters 74 and 76, respectively, to form the boosted voltages $V_H$ and $V_L$. The boosted voltages $V_H$ and $V_L$ may be several times more positive than Vcc and more negative than Vss voltages. For example, $V_H$ may be in the range of 4 to 12 volts while $V_L$ may be in the range of −2 to −5 volts. Alternatively, the die 10 may receive all of Vcc, Vss, $V_H$ and $V_L$ from external voltage supplies.

Figure 3:
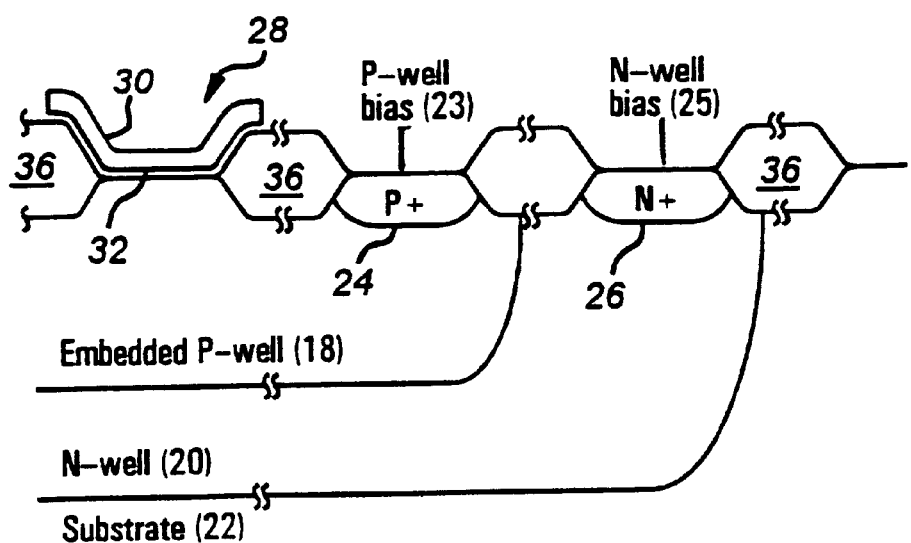
FIG. 3 is a partial, enlarged cross-sectional view taken generally along the line 3—3 in FIG. 1.

The configuration of the transistors in the area 16 is illustrated in FIG. 3. A device 28 is formed in an embedded P-well 18. The embedded P-well 18 is formed in an N-well 20 which is, in turn, defined within a P-type semiconductor substrate 22. P-well bias 23 may be applied through a P+ region 24, and N-well bias 25 may be applied through an N+ region 26. The transistor 28 includes a gate electrode 30 and a gate oxide 32 with an active region defined by field oxide areas 36.

Figure 4:
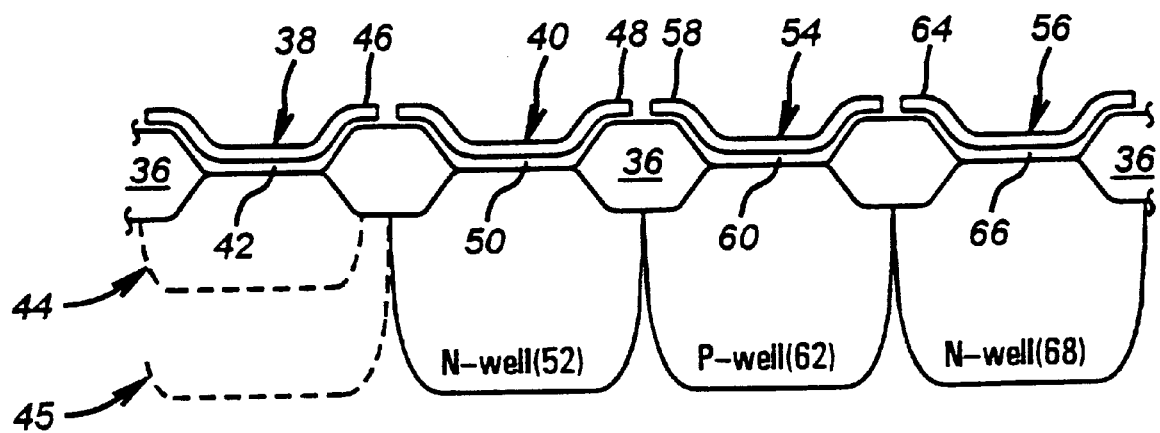
FIG. 4 is a partial, enlarged cross-sectional view taken generally along the line 4—4 in FIG. 1.

The region 14 may include CMOS N- and P-channel transistors 38 and 40, as shown in FIG. 4. The thick gate oxide N-channel transistor 38 may include a thick gate oxide 42 and a gate electrode 46. Similarly, the thick gate oxide P-channel transistor 40 includes a gate electrode 48 formed over a thick gate oxide 50, in turn defined over an N-well 52.

The transistor 38 may be formed without a P-well or with a light P-well 44 or a light P-well 44 embedded in N-well 45 so that it is a zero threshold transistor. By "zero threshold" it is intended to refer to transistors with relatively light P-wells, for example, less than $1 \times 10^{16}$ atoms per square centimeter, or no P-well at all. Thus, the zero threshold transistor may have a small threshold voltage of from about 0.1 to −0.3 volts.

Finally, the region 12 is populated by N- and P-channel transistors, such as the transistors 54 and 56, shown in FIG. 4. The N-channel "regular" gate oxide transistor 54 includes a gate 58, a gate oxide 60, and a P-well 62. Likewise, the "regular" gate oxide P-channel transistor 56 includes a gate electrode 64, a gate oxide 66 and an N-well 68. The transistors 54 and 56 may be conventional in all respects. They are formed with gate oxides that are thinner than the gate oxides of the transistors 28, 38, and 40 formed in the area 14.

Figure 5:
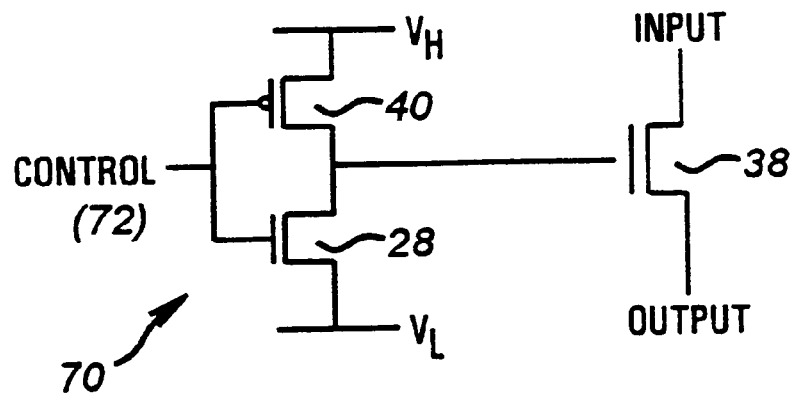
FIG. 5 is a circuit diagram of one illustrative NMOS transfer gate.

Referring now to FIG. 5, the thick gate oxide N-channel transistor 38 may implement a transfer gate driven by an inverter 70. The inverter 70 may include a thick gate oxide P-channel transistor 28. The control signal 72 may be a boosted positive ($V_H$) or negative ($V_L$) signal which causes the inverter 70 to supply either the boosted positive potential $V_H$ or the more negative potential $V_L$ as the drive bias for the gate of the transistor 38.

The boosted voltages $V_H$ or $V_L$ may be formed by boosting positive (Vcc) and negative (Vss) supply voltages supplied to the die 10, using conventional charge boosting circuitry 74, 76. These boosted gate drive voltages increase the difference ($V_{GS}-V_T$), thereby decreasing the "on" resistance and increasing the saturation voltage of the transfer gate implemented by the transistor 38.

If the control signal 72 is $V_H$, the inverter 70 supplies the voltage $V_L$ to the gate of the transistor 38. The transistor 38 is then "off". When the control signal 72 is $V_L$, the high positive voltage $V_H$ is applied to the gate of the transistor 38 and the transistor is "on". The transistor 38 can be turned off hard, because of the negative gate voltage.

Figure 6:
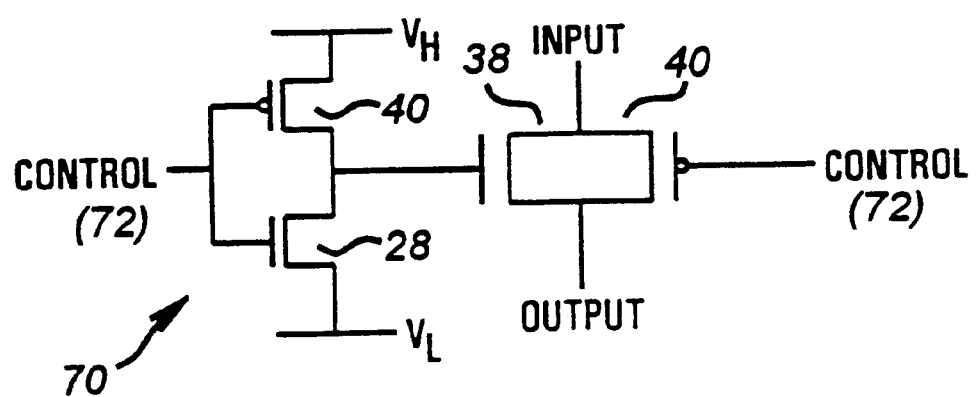
FIG. 6 is a circuit diagram of one illustrative CMOS transfer gate.

A CMOS implementation of the transfer gate, shown in FIG. 6, uses the same inverter 70 arrangement, but includes a parallel pair of N-channel 38 and P-channel 40, thick gate oxide transistors. The gate of the P-channel transistor 40 is driven by the control signal 72.

While FIGS. 5 and 6 illustrate an inverter 70 controlling the potential on the gate of a pass transistor, it should be understood that a variety of other circuits can be used for this purpose.

The transfer gate "on" resistance for the linear region can typically be reduced by a factor of two to four depending on the gate bias. At the same time, the thicker gate oxide of the transfer gate allows more gate voltage to be applied to the transistor without creating reliability problems.

Thus, the term $V_{GS}-V_T$ may be increased without causing gate oxide reliability problems. Typically, in 0.6 micron or less technologies, using 3 volts or less, the gate oxides 32, 42, and 50 may be 120 Angstroms or greater while the gate oxides 60 and 66 may be less than 100 Angstroms.

By providing an embedded P-well transistor 28, the N-well 20 may be tied to Vss or Vcc. This allows the P-well to be pumped negatively. This in turn allows the source of the transistor, situated in the P-well, to go negative. Therefore, a negative voltage may be applied to the source of the transistor 28 in the configuration shown in FIG. 5. This enables the transistors 28 and 38 to shut off hard.

The negative gate drive also reduces the gate-to-N junction overlap capacitance and the junction capacitance. Because of the negative gate voltage, the channel and well doping concentrations can be reduced. Hence, one transistor 38 is situated in a "light" P-well 44. Typically, the P-well doping concentration may be reduced or eliminated. For example, well doping may be reduced from a typical concentration of $1 \times 10^{17}$ to $1 \times 10^{16}$ atoms per square centimeter or less. This may achieve a substantial reduction in the junction capacitance of the transistor. The negative voltage also reduces the N-depletion capacitance in the N-region under the gate oxide typically by a factor of two to three. Furthermore, by embedding the transfer gate in a P-well, when the N-well is tied to Vss or Vcc, negative voltage can be applied to the P-well and the junction depletion region increases. This reduces the junction capacitance even further, for example, by a factor of 1.5.

The charge pump for creating the high and low voltages $V_H$ and $V_L$ can be implemented using standard charge pump designs. The reference "On Chip High Voltage Generation and MOS Integrated Circuits Using an Improved Voltage Multiplier Technique", *IEEE Journal of Solid State Circuits*, Vol. SC-11, No. 3, June 1976, discloses one useful design for creating the high voltage charge pump and is hereby expressly incorporated herein. Similarly, the provision of both a positive or negative boosted voltage can be accomplished as taught in L. A. Glasser and D. W. Dobberpuhl, *The Design and Analysis of VLSI Circuits*(December 1985) published by Addison-Wesley Publishing Co, pages 301–329, which is hereby expressly incorporated by reference herein.

Ideally, the boosted voltage $V_H$ is set to the highest possible voltage before any long term gate oxide reliability problems occur. This reduced the "on" state resistance of the pass or transfer gate. The voltage $V_L$ is set at a low voltage such that the N-junction capacitance can be reduced. Typically $V_L$ is −1.5 to −2.0v.

The thickness of the thick gate oxides for the transistors 28, 38 and 40 can be determined by first determining the maximum voltage level that needs to be transferred by the transfer gate 38. Normally this transfer voltage is equal to Vcc. The transistor saturation voltage, "$V_{DSAT}$", is set such that $V_{DSAT}$ is greater than or approximately equal to the transfer voltage. Thus, the transistor always operates in the linear region. Using the following equation, the term "$V_{GS}-V_T$" can be determined:

$$V_{DSAT} = A + B - \sqrt{A^2 + B^2}$$

Where:

$A = (V_{GS} - V_T)/(1+\delta)$;

$B = (V_{MAX} L/\mu)$ $V_T$ = the transistor threshold voltage

L = channel length $\mu$ = mobility and $V_{MAX}$ = maximum carrier velocity (~$10^7$ cm./s)

$$\delta = \frac{\gamma}{2\sqrt{V_S B + 2\phi_{FP}}}$$

$$\gamma = \frac{\sqrt{2\varepsilon_{si} q N a}}{Cox}$$

Where:

$V_S B$ = source to bulk potential $\phi_{FP}$ = potential at inversion surface $\varepsilon_{si}$ = silicon dielectric constant Na = bulk doping concentration Cox = oxide thickness q = electron charge The oxide thickness Cox is generally greater than or approximately equal to ($V_{GS}-V_T$) divided by the electric field ($\varepsilon$) or about 4 to about 5 megavolts per centimeter. Thus, for a 3-volt transfer voltage, $V_{GS}-V_T$ is approximately 6 to 8 volts and Cox would be about 150 to 200 Angstroms with a channel length of from about 0.6 to 0.8 microns.

A few examples may help to appreciate the impact of embodiments of the present invention. Using a thicker gate oxide thickness of 150 Angstroms and a channel length of 0.6 microns, the quantity $V_{GS}-V_T$ is approximately 6 volts. The transistor current at a $V_{DSAT}$ of 3 volts results in a drain current of about 750 microamps per micron at 3 volts. The drain current is about 633 microamps per micron at 2 volts.

This can be contrasted with a conventional technology which would have a gate oxide thickness of about 100 Angstroms, a gate length of about half a micron using 3-volt technology. The transistor current at a $V_{DSAT}$ equal to 3 volts is approximately 330 microamps per micron. It is evident that the thick gate oxide enables a significantly greater drive current.

Similarly, with a 2-volt technology using a gate oxide thickness of 70 Angstroms and a gate length of 0.35 microns, the drain current would be approximately 250 microamps per micron. Thus, it is evident that decreasing gate lengths and decreasing gate voltages have a dramatically adverse effect on drain current. This necessarily has a severe impact on speed.

Thus, it can be seen that at supply voltages of 3 volts and less, device scaling can result in slower devices. The present invention allows for significantly increased transistor speeds at significantly scaled geometries and with significantly scaled supply voltages.

The illustrative parameters set forth herein contemplate a 0.35 $\mu$m or higher feature size with Vcc potentials of 2.7 volts or higher. As the technology permits lowering voltages and smaller feature sizes, the parameters herein would scale accordingly.

The starting substrate is typically P-type (100) silicon, for example having a resistivity range of 10–25 ohm-cm. The P-well 18 is embedded in an N-well 20 in the so-called triple well process. The P-well has a typical well depth of, for example, 2 to 4 $\mu$m with an average doping concentration, for example, In the range of $5 \times 10^{15}$ to $5 \times 10^{16}$ atoms per cubic centimeter.

The N-well has a typical well depth of, for example, 4–8 $\mu$m. The doping concentration may be from $4 \times 10^{15}$ to $1 \times 10^{16}$ atoms per cubic centimeter. The triple well is formed by the P-well 18 counterdoping the N-well 20.

The formation of the elements in the triple well may be as follows in one embodiment. An N-well implant is done, for example, with phosphorous ($P_{31}$) with a typical dose of 1.0 to $1.5 \times 10^{13}$ atoms per square centimeter and energies from 160 Kev to about 100 Kev. The N-well implant is driven using a high temperature step which may typically be 6 to 12 hours at 1125 to 1150° C. The N-well 20 is then counter-doped with a P-well implant. Typical dosages for the P-well implant may be 1.5 to $2.5 \times 10^{13}$ atoms per square centimeter with energies of 30 Kev to 180 Kev using a species such as boron (B11).

The N-well 20 and P-well 18 are then driven, typically 6 to 10 hours at 1125 to 1150° C. This sets the wells to the desired doping concentrations and depths.

After well formation, standard logic field oxide formation and channel stop formation steps are applied. The field oxide 36 and implant doses are adjusted to achieve a field threshold of 7 to 14 volts, which is determined by the $V_H$ level of the booster pump 74. After removal of sacrificial oxide, the thick gate oxides 42, 50 and the thin gate oxides 60, 66 are formed. For example, a 100 Angstrom oxide may be grown across the wafer followed by threshold adjustment implants. Afterward, resist is applied. The resist may cover everything except the thin oxide areas 60 and 66. A buffered oxide etch (BOE) is used to etch off the oxide in the region that is not covered by resist. After resist removal, an oxide is grown to a thickness, for example 100 Angstroms, to form the thin oxides 60 and 66. The rest of the wafer uses gate oxides 42 and 50 with a typical thickness of 160 Angstroms. Standard gate deposition, patterning and back end processing follows the standard logic process. This forms transistors with two gate oxide thicknesses.

Figure 7:
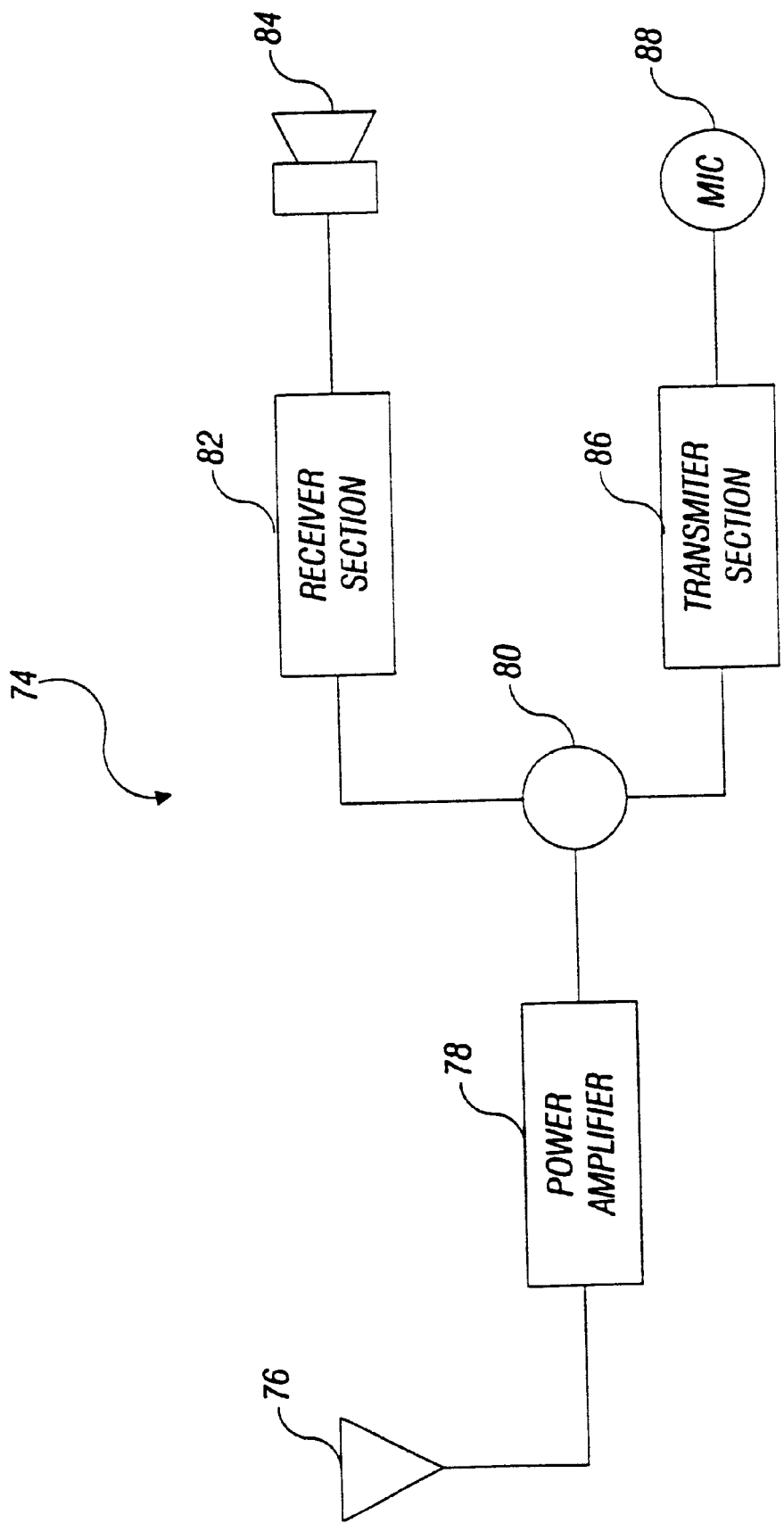
FIG. 7 is a block diagram of a radio frequency device in accordance with one embodiment of the present invention.

Referring now to FIG. 7, a radio frequency device 74 includes an antenna 76 coupled to a power amplifier 78. The antenna 76 may be a separate unit or may be integrated into the integrated circuit 74. The power amplifier 78 is coupled to a splitter 80 which may be coupled to a radio frequency receiver section 82 and a speaker 84 or a transmitter section 86 and a microphone 88.

One or both of the receiver section 82 and transmitter section 86 may include logic devices which advantageously are made with the latest high frequency processing technology. As a result, these devices operate at high switching speeds and exhibit high switching speed performance. This may improve the speed of operation of various functions involving logical operations.

If the power amplifier 78 is integrated with those logic circuits, the power amplifier may have relatively limited output power performance because the high frequency transistors generally must use lower supply voltages. These lower supply voltages limit the output power available from the power amplifier 78.

This problem may be overcome by using the thick gate transistors 38 or 40 in connection with the power amplifier 78 and using the thin gate transistors 54 and 56 in connection with the logic circuits in the receiver section 82 and transmitter section 86.

However, by forming the power amplifier 78 with relatively thick gate oxides, a higher supply potential may be provided for those transistors improving their output power performance. Thus, two different gate voltage levels may be utilized, a lower one for the regular gate transistors 54 and 56 and a higher level may be utilized for the thicker gate transistors 38 and 40. This higher voltage level for the transistors 38 and 40 enables the output power from the amplifier 78 to be increased relative to what it would have been using the latest transistor technologies with reduced supply voltages.

As a result, radio frequency devices 74 may be made that exhibit high transistor switching speed and high performance logic circuit sections. At the same time, relatively high output power levels may be achieved as well. In some cases, this may facilitate the integration of radio frequency and logic components including processors and the like on the same integrated circuit.

While the present invention has been described with respect to a single preferred embodiment, those skilled in the art will appreciate a number of modifications and variations, and it is intended that the appended claims cover all such modifications and variations which fall within the true spirit and scope of the present invention.

What is claimed is:

1. A radio frequency integrated circuit device formed on a semiconductor die comprising:

a power amplifier including a first group of integrated MOS transistors formed on said die, said first group of transistors having gate oxides of a first thickness; and a second group of integrated MOS transistors formed on said die outside the power amplifier, said second group of transistors having gate oxides, said gate oxides of said first group of transistors being thicker than said gate oxides of said second group of transistors.

2. The device of claim 1 wherein the oxide thicknesses of said first and second group of integrated MOS transistors are equal to or greater than the gate to source voltage minus the threshold voltage divided by 5 megavolts per centimeter.

3. The device of claim 1 wherein said gate oxides of said first group of transistors are about 100 Angstroms or less and said gate oxides of said second group of transistors are about 120 Angstroms or greater.

4. The device of claim 1 wherein said device receives an external supply voltage, said gate electrode of said first group of transistors for connection to said external supply voltage, the gate electrode of said second group of transistors being connectable to a voltage greater than said supply voltage.

5. The device of claim 1 including a transmitter section and a receiver section selectively connectable to said power amplifier.

6. The device of claim 5 including an antenna coupled to said power amplifier.

7. The system of claim 1 including a processor formed of said second group of integrated MOS transistors.

8. The device of claim 1 wherein said first group of integrated MOS transistors are capable of generating more output power than said second group of integrated MOS transistors.

9. The device of claim 8 wherein said second group of integrated MOS transistors are capable of higher switching speeds than said first group of integrated MOS transistors.

10. The device of claim 1 including a power supply circuit to deliver a higher voltage to said first group of transistors and a lower voltage to said second group of transistors.

11. The device of claim 10 including a higher and a lower voltage supply coupled to said power supply circuit.

12. A method comprising:

forming an integrated power amplifier circuit including a first group of integrated MOS transistors having gate oxides of a first thickness; and forming an integrated circuit device including a second group of integrated MOS transistors formed on the same die outside said power amplifier, said second group of transistors having gate oxides, said gate oxides of said first group of transistors being thicker than the gate oxides of said second group of transistors.

13. The method of claim 12 wherein forming an integrated circuit device includes forming a complementary metal oxide semiconductor integrated circuit.

14. The method of claim 13 including forming both N-channel and P-channel transistors in at least one of said first and second groups, some of said N-channel transistors having thicker gate oxides than others of said N-channel transistors and some of said P-channel transistors having thicker gate oxides than other of said P-channel transistors.

15. The method of claim 12 including enabling said first group of integrated MOS transistors to operate with a higher output power than said second group of integrated MOS transistors.

16. The method of claim 15 including designing said second group of integrated MOS transistors to operate with higher switching speeds than said first group of integrated MOS transistors.

17. The method of claim 12 if including providing a power supply circuit to deliver a higher voltage to said first group of transistors and a lower voltage to said second group of transistors.

* * * * *